US006690193B1

(12) United States Patent
Heinzer et al.

(10) Patent No.: US 6,690,193 B1
(45) Date of Patent: Feb. 10, 2004

(54) ONE-TIME END-USER-PROGRAMMABLE FUSE ARRAY CIRCUIT AND METHOD

(75) Inventors: Walter Heinzer, Milpitas, CA (US); Azita Soroushian-Ashe, Saratoga, CA (US); Pak W. Kung, Stockton, CA (US); Derek Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/227,723

(22) Filed: Aug. 26, 2002

(51) Int. Cl.[7] .................................. H03K 19/177
(52) U.S. Cl. ........................ 326/37; 326/38; 326/47
(58) Field of Search ............................... 326/37, 38, 41, 326/39, 47

(56) References Cited

U.S. PATENT DOCUMENTS 5,635,854 A * 6/1997 Shimanek et al. ............ 326/38

OTHER PUBLICATIONS

Analog Devices, Low Cost PC Hardware Monitor ASIC, ADM 1025/ADM1025A, (2002) pp. 1–16. (Rev.B).

* cited by examiner

Primary Examiner—Anh Tran
(74) Attorney, Agent, or Firm—Koppel, Jacobs, Patrick & Heybl

(57) ABSTRACT

A one-time end-user-programmable fuse array circuit suitable for providing a digital input to a programmable analog element such as a DAC. An end-user-specified digital bit pattern is conveyed to a programming circuit, which programs an array of data fuses in accordance with the specified pattern. A validation means indicates whether the states of the data fuses match the specified pattern. The programming circuit blows a "lock" fuse when the data fuses match the specified pattern, which prevents any additional data fuses from being programmed. The specified pattern and the states of the data fuses are multiplexed to a programmable analog element. Initially, the end-user can vary the pattern to achieve a desired result from the programmable element. When the desired result is achieved, the data fuses are blown, the resulting pattern is validated, and the lock fuse is blown—thereby providing a permanent trim signal.

18 Claims, 3 Drawing Sheets

ONE-TIME END-USER-PROGRAMMABLE FUSE ARRAY CIRCUIT AND METHOD

BACKGROUND OF THE INVENTION

1. Field of the Invention

This invention relates to the field of programmable fuse arrays, and particularly to a one-time programmable fuse array which can be programmed by an end-user.

2. Description of the Related Art

Programmable fuse arrays are commonly used in conjunction with electronic circuits which may require adjustment to provide proper operation. Each fuse circuit in such an array provides either a logic one or a logic zero, depending on whether or not its fuse is "blown". A digital word is thus provided by selectively blowing the fuses in an array. The digital word is applied to, for example, a digital-to-analog converter (DAC) to provide a desired adjustment voltage. For example, an operational amplifier may be designed such that its offset voltage can be adjusted via the application of a voltage at a trim input; once the necessary voltage is determined, a programmable fuse array which drives a DAC can be programmed so that the necessary trim voltage is provided.

The fuses in a programmable fuse array may be programmed one time only; i.e., a blown fuse cannot be made intact again. Conventionally, such arrays are programmed in an integrated circuit (IC) manufacturing facility, to calibrate or trim the characteristics of an electronic device prior to its being made available to customers. Due to the permanency of the programming and the difficulties associated with determining the necessary digital bit pattern and successfully performing the programming, such arrays have not been made accessible to the end-user customers. Other technologies, such as flash memory and EEPROMs, provide a similar function and are available to end-users. However, these approaches can require a considerable amount of circuitry to implement, which may add unacceptable costs or complexity to the device as well as result in a silicon die area which exceeds that which is available.

SUMMARY OF THE INVENTION

A one-time end-user-programmable fuse array circuit and method are presented, which overcome the problems noted above.

The invention enables an end-user to permanently program a programmable fuse array circuit suitable for providing a digital input to a programmable analog element such as a DAC, a digital potentiometer, or a capacitor array. The fuse array circuit includes a plurality of programmable data fuses, each of which is transformed from an "intact" state to a "blown" state in response to a respective program signal, and a programmable "lock" fuse which, when blown in response to a program signal, prevents any additional data fuses from being transformed to their blown state.

A desired end-user-specified digital bit pattern is conveyed to a programming circuit, preferably via a standard digital interface. The programming circuit is arranged to provide program signals to respective programmable data fuses in accordance with the specified bit pattern. To ensure that the data fuses are properly programmed, the invention includes a validation means which produces an output that indicates when the states of the data fuses match the specified pattern. The programming circuit receives the output of the validation means, and blows the lock fuse when the validation means indicates that the data fuses match the specified pattern.

The end-user-specified bit pattern and the states of the data fuses are multiplexed to a programmable analog element. Initially, the specified pattern is conveyed to the programmable element; the pattern can be varied as necessary to achieve a desired result from the programmable element. When the desired result is achieved, the data fuses are blown and the resulting pattern validated. If the data fuses were blown properly, the lock fuse is blown, and the states of the data fuses are conveyed to the programmable element—thereby providing a permanent trim signal.

Further features and advantages of the invention will be apparent to those skilled in the art from the following detailed description, taken together with the accompanying drawings.

DETAILED DESCRIPTION OF THE INVENTION

The present invention enables an end-user to program a programmable fuse array, which can then be used to provide a digital input to a programmable analog element. A "programmable analog element" is any device which produces an output that varies with a digital input, such as a DAC.

Figure 1:
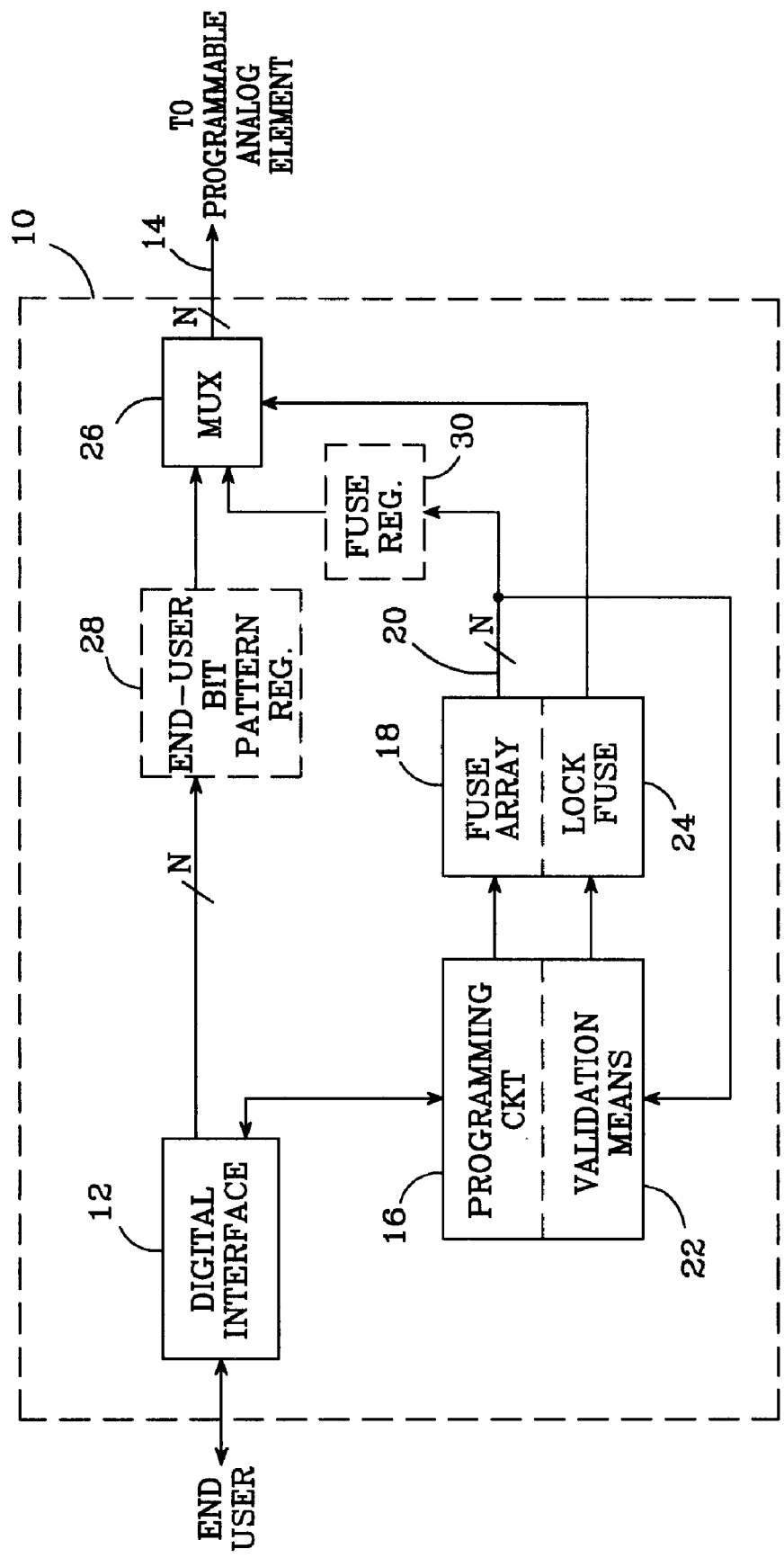
FIG. 1 is a block diagram of a one-time end-user programmable fuse array circuit per the present invention.

The basic principles of a one-time end-user programmable fuse array circuit 10 in accordance with the present invention are illustrated in FIG. 1. The end-user of an IC which includes the present invention communicates an N-bit digital bit pattern to fuse array circuit 10 via a digital interface 12. Initially, this end-user-specified bit pattern is provided at the fuse array circuit output 14, which is suitably connected to a programmable analog element; the end-user can vary the bit pattern as desired, which in turns varies the output produced by the programmable analog element.

Fuse array circuit 10 also includes a programming circuit 16, and an array 18 of at least N programmable data fuses. Each programmable data fuse is transformed from an "intact" state to a "blown" state in response to a respective program signal received from programming circuit 16. Programming circuit 16 receives the digital bit pattern specified by the end-user, as well as control instructions which are also initiated by the end-user. When the end-user identifies a digital bit pattern which produces a desired result from the programmable analog element (referred to herein as the "identified bit pattern"), a predetermined control instruction is provided to programming circuit 16. In response, programming circuit 16 programs N data fuses in array 18 in accordance with the identified bit pattern; the states of the N data fuses are available at the output 20 of fuse array 18.

It is an essential aspect of the invention that an end-user can confirm that the identified bit pattern has been successfully programmed into the data fuses of array 18. This capability is provided by a validation means 22, which may be either internal or external to programming circuit 16.

Validation means 22 compares the identified digital bit pattern provided by the end-user with the states of the N data fuses provided at output 20. The results of the comparison (identified pattern and data fuse states "match" or "do not match") are reported back to the end-user via digital interface 12.

If the comparison reveals that the N data fuses were successfully programmed in accordance with the identified bit pattern, programming circuit 16 blows a "lock" fuse 24. Blowing lock fuse 24 has two effects: 1) no further programming of the data fuses is allowed, and 2) the states of the data fuses are conveyed to fuse array circuit output 14. This may be accomplished using, for example, a multiplexer 26 which is controlled by the state of lock fuse 24: the mux conveys the end-user-specified bit pattern to output 14 when the lock fuse is intact (data fuses not yet successfully programmed), and conveys the states of the data fuses to output 14 when the lock fuse is blown (data fuses successfully programmed).

The invention therefore allows an end-user to vary a trim signal as necessary to achieve a desired result from the programmable element. The resulting pattern is validated, with the end-user notified of the outcome. If the data fuses were blown properly, the lock fuse is blown, and the states of the data fuses are thereafter conveyed to the programmable element—thereby providing a permanent trim signal.

Fuse array circuit 10 preferably includes an end-user bit pattern register 28 which stores the digital bit pattern conveyed to digital interface 12 by an end-user, and a fuse register 30 which stores the states of the data fuses. Use of fuse register 30 enables the states of the data fuses to be latched at power up, and after the data fuses are programmed, so that fuse array 18 can be turned off to conserve power.

Figure 2:
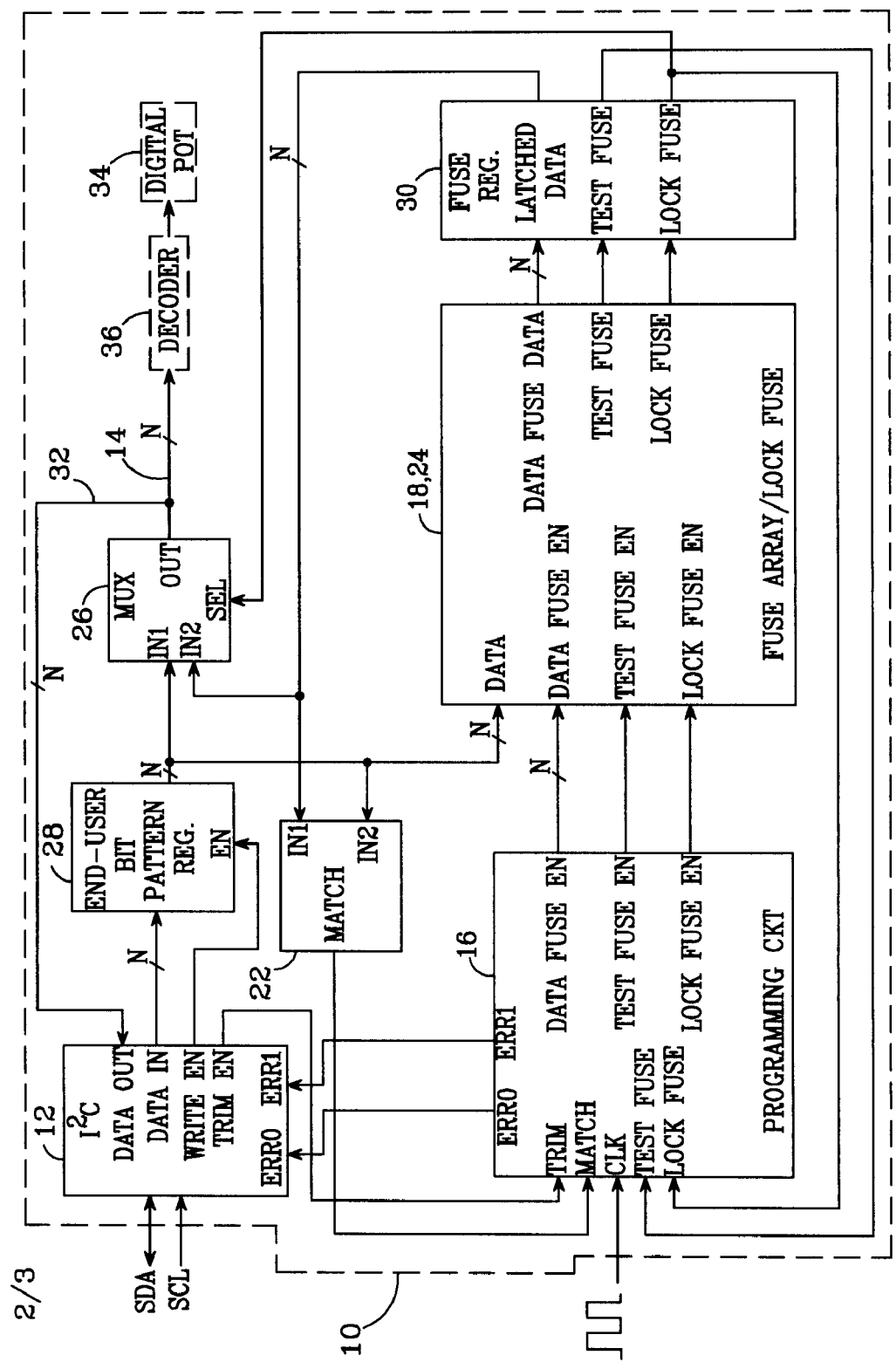
FIG. 2 is a block diagram of a preferred embodiment of a one-time end-user programmable fuse array circuit per the present invention.

A preferred implementation of a one-time end-user programmable fuse array circuit 10 per the present invention is shown in FIG. 2. Digital interface 12 is preferably a standard $I^2C$ 2-wire bi-directional serial interface, though other serial (e.g., SPI, DSP, Up/Down) or parallel interfaces could also be employed. The interface circuit is arranged to process the incoming data and control instructions. An end-user-specified N-bit digital bit pattern is conveyed via the interface's "DATA IN" output to end-user bit pattern register 28. Interface 12 toggles a "write enable" (WRITE EN) signal whenever a newly-specified bit pattern has been completely received, which causes end-user bit pattern register 28 to latch the bit pattern. The output of register 28 is provided to the first input (IN1) of multiplexer 26, which is controlled via its select input (SEL) by the state of the lock fuse. While the lock fuse is intact, multiplexer 26 conveys the bit pattern stored in register 28 to fuse array circuit output 14.

The output of register 28 is also provided to programmable fuse array 18. When the end-user is satisfied with the results achieved with the bit pattern stored in register 28 (i.e., the identified bit pattern), an appropriate control instruction is provided to interface 12, which in turn toggles a "trim enable" (TRIM EN) signal provided to programming circuit 16. Programming circuit 16 responds by sending up to N program signals to fuse array 18 to cause the identified bit pattern to be programmed into the data fuses. When the programming is completed, the states of the data fuses are latched into fuse register 30, which presents them to the second input (IN2) of multiplexer 26.

Once the data fuses have been programmed, their states must be validated. This is preferably accomplished by implementing validation means 22 with a comparator, which receives the outputs of end-user bit pattern register 28 and fuse register 30 at respective inputs. The comparator outputs a MATCH signal, which has a first state when the contents of the two registers match—indicating that the data fuses were correctly programmed, and a second state when the two registers do not match. The MATCH signal is provided to programming circuit 16.

When MATCH indicates that the data fuses were correctly programmed, programming circuit 16 toggles a programming signal ("LOCK FUSE EN"), which causes lock fuse 24 to be blown. The state of lock fuse 24 is latched into fuse register 30, and the latched lock fuse state is provided to multiplexer 26 and programming circuit 16. Multiplexer 26 responds by conveying the data latched in fuse register 30 to output 14, and programming circuit 16 responds by preventing any additional programming of fuse array 18.

The results of the validation are conveyed to the end-user. This is preferably accomplished with the use of two validation bits ERR0 and ERR1, which are conveyed from programming circuit 16 to digital interface 12, and then to the end-user. If MATCH indicates that the data fuses were correctly programmed, ERR1 and ERR0 take on predetermined values such as "1" and "1". If MATCH indicates that the data fuses were not correctly programmed, ERR1 and ERR0 take on different predetermined values, such as "1" and "0", respectively. The output of multiplexer 26 is preferably also made available to the end-user, via a connection 32.

Fuse array 18 preferably also includes a "test" fuse, which is used to test whether fuse array circuit 10 is operating correctly prior to programming the data fuses. When the end-user causes the TRIM EN signal to be toggled, programming circuit 16 begins a programming sequence which would typically be paced with a clock signal (CLK). As a first step in the sequence, programming circuit 16 provides a program signal (TEST FUSE EN) to fuse array 18 to blow the test fuse. The state of the test fuse is latched by fuse register 30 and reported back to programming circuit 16. If the test fuse is successfully blown, the N data fuses will be programmed during the next N clock cycles. If the test fuse was not successfully blown, the validation bits take on values (e.g., ERR1=0, ERR0=1) which indicate this to the end-user.

The present invention might also include a second test fuse, similar to the test fuse described above. Here, however, the test fuse would be intended for programming by the manufacturer, to test the functionality of the one-time end-user programmable fuse array circuit prior to its being made available to end-users.

As noted above, the digital bit pattern output 14 of the programmable fuse array can be provided to any programmable analog element having an output which varies with a digital input. For example, output 14 might be connected to a DAC's digital input, which would provide a desired analog output voltage in response. Another example is shown in FIG. 2, in which a programmable digital potentiometer 34 is controlled by output 14 to provide a desired resistance. Similarly, output 14 could be connected to a programmable capacitor array to achieve a desired capacitance. A decoder circuit 36 could be interposed between output 14 and the programmable analog element to reduce the number of I/O pins required by the fuse array circuit.

The present invention can be provided independently of a programmable analog element, and then connected to an element to provide the necessary programming. Alternatively, the invention might be incorporated with a programmable analog element, thereby providing a complete end-user-programmable device. For example, an IC might include a programmable digital potentiometer and a one-time end-user programmable fuse array circuit as described herein. When so arranged, the end-user could monitor the resistance of the potentiometer, or the effect of the resistance on another circuit, while varying the digital bit pattern provided to digital interface 12. When a satisfactory result was achieved, the end-user provides the necessary control information to initiate the fuse array's programming sequence. When completed, the potentiometer is permanently programmed.

It should be noted that the embodiment of the invention shown in FIG. 2 is but one possible implementation. Many other circuit arrangements could be used to provide the functionality described herein. For example, the program signals conveyed from programming circuit 16 to fuse array 18 can be sent serially, as described above, or in parallel. Similarly, while the output of end-user bit pattern register 28 is shown connected directly to fuse array 18, it might alternatively be connected to programming circuit 16.

Figure 3:
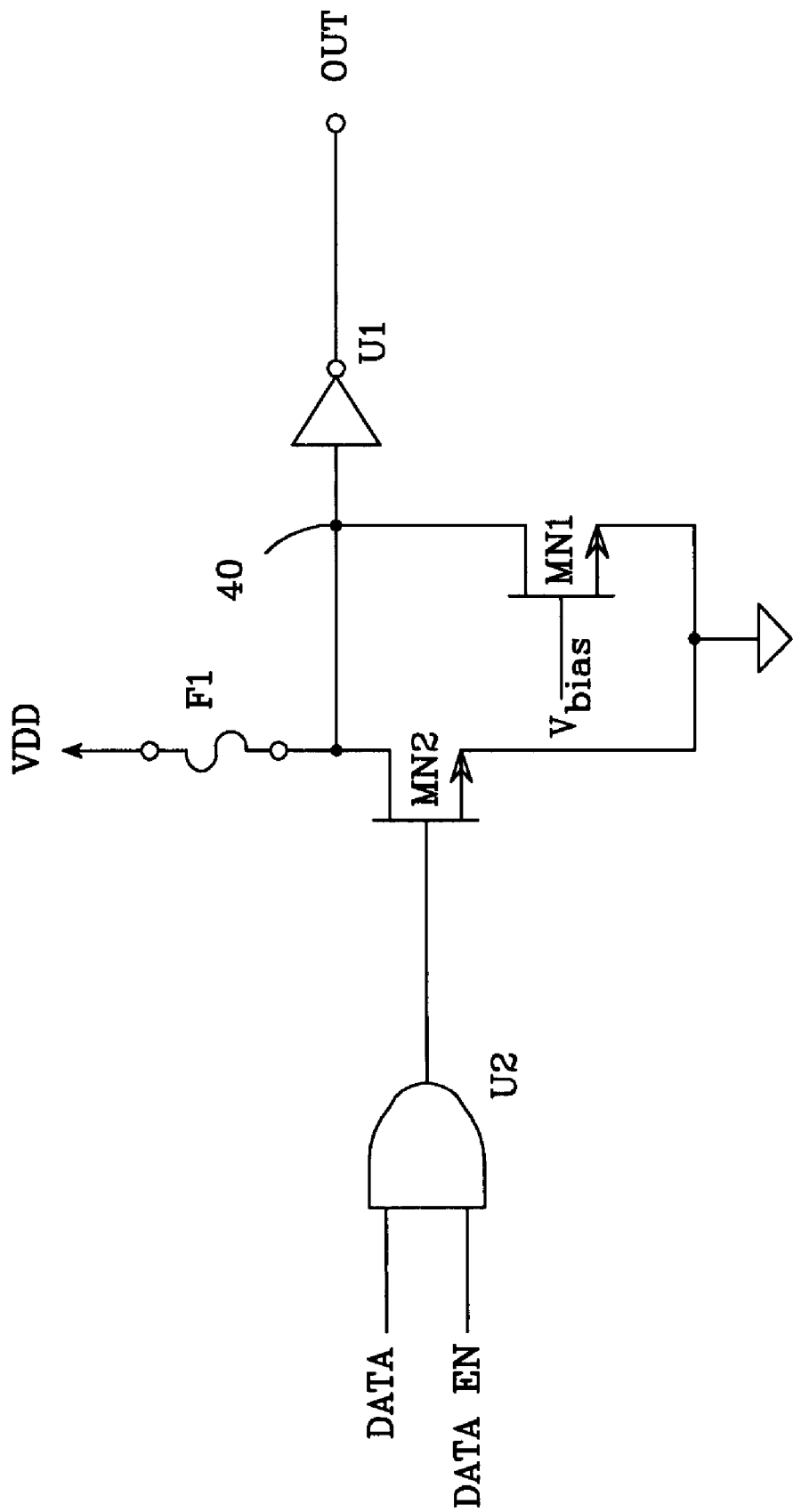
FIG. 3 is a schematic of one possible embodiment of a programmable fuse cell as might be used with the present one-time end-user programmable fuse array circuit.

The programmable fuse array may employ any of several technologies, including fuse link, zener zapping, or blown-oxide. One possible implementation of a programmable data fuse cell is shown in FIG. 3. A fuse link F1 is connected between a supply voltage and a node 40; node 40 is also connected to a pull-down transistor MN1 and an inverter U1. When F1 is intact, node 40 is a logic "high", and the output (OUT) of U1—and thus the state of the data fuse—is a logic "low". F1 is blown via a transistor MN2, which is controlled by an AND gate U2. U2 receives a DATA input derived from the end-user's identified bit pattern, and a DATA EN input, which is the program signal received from the programming circuit. When both inputs are high, MN2 is turned on, F1 is blown, node 40 is pulled low, and OUT goes high. If DATA is low, F1 remains intact when the program signal is asserted, and OUT remains low. In this way, OUT achieves the desired state every time the cell is powered up. As noted above, a fuse register preferably latches the OUT signals from all of the fuse cells after power up, so that the cells may be powered off to conserve power.

While particular embodiments of the invention have been shown and described, numerous variations and alternate embodiments will occur to those skilled in the art. Accordingly, it is intended that the invention be limited only in terms of the appended claims.

We claim:

1. A one-time end-user-programmable fuse array circuit suitable for programming a programmable analog element, comprising:

a programmable fuse array comprising:
   a plurality of programmable data fuses, each of which is transformed from an "intact" state to a "blown" state in response to a respective program signal, and
   a programmable lock fuse which, when blown in response to a program signal, prevents any additional data fuses from being transformed to their blown state, a digital interface which conveys an end-user-specified digital bit pattern to a programming circuit, a programming circuit arranged to provide said program signals to said programmable data fuses in accordance with said end-user-specified digital bit pattern, and a validation means which outputs a first signal when the states of said data fuses match said end-user-specified digital bit pattern and a second signal when the states of said data fuses do not match said end-user-specified digital bit pattern, said programming circuit further arranged to receive said validation means output and to provide said program signal to blow said lock fuse when said validation means indicates that the states of said data fuses match said end-user-specified digital bit pattern, said one-time end-user-programmable fuse array circuit arranged to provide said end-user-specified digital bit pattern at a fuse array circuit output when said lock fuse is intact and to provide the states of said data fuses at said fuse array circuit output when said lock fuse is blown.

2. The end-user-programmable fuse array circuit of claim 1, wherein said validation means comprises a comparator which receives the states of said data fuses and said end-user-specified digital bit pattern at respective inputs and which produces said first signal when the states of said data fuses match said end-user-specified digital bit pattern and produces said second signal when the states of said data fuses do not match said end-user-specified digital bit pattern.

3. The end-user-programmable fuse array circuit of claim 2, further comprising a first register connected to said digital interface and arranged to store said end-user-specified digital bit pattern, and a second register connected to said data fuses and arranged to store their respective states, said comparator connected at its inputs to said first and second registers.

4. The end-user-programmable fuse array circuit of claim 3, further comprising a multiplexer which conveys the contents of said first register to said fuse array circuit output when said lock fuse is intact and conveys the contents of said second register to said fuse array circuit output when said lock fuse is blown.

5. The end-user-programmable fuse array circuit of claim 4, further comprising a programmable analog element, the operation of which is controlled by said fuse array circuit output.

6. The end-user-programmable fuse array circuit of claim 5, wherein said programmable analog element is a programmable digital potentiometer.

7. The end-user-programmable fuse array circuit of claim 5, wherein said programmable analog element is a digital-to-analog converter (DAC).

8. The end-user-programmable fuse array circuit of claim 5, wherein said programmable analog element is a programmable capacitor array.

9. The end-user-programmable fuse array circuit of claim 1, further comprising a first programmable test fuse which, when successfully blown in response to a program signal, indicates that said one-time end-user-programmable fuse array circuit is functioning properly, said programming circuit arranged to:

provide said program signal to blow said first programmable test fuse prior to providing said program signals to said programmable data fuses, determine the state of said first programmable test fuse, and to provide an output which indicates the state of said first programmable test fuse.

10. The end-user-programmable fuse array circuit of claim 9, further comprising a manufacturer-programmable test fuse which, when successfully blown in response to a program signal, indicates that said one-time end-user-programmable fuse array circuit is functioning properly, said programming circuit arranged to:

provide said program signal to blow said manufacturer-programmable test fuse, determine the state of said manufacturer-programmable test fuse, and to provide an output which indicates the state of said manufacturer-programmable test fuse.

11. The end-user-programmable fuse array circuit of claim 1, wherein said digital interface is an I²C interface.

12. A one-time end-user-programmable fuse array circuit suitable for programming a programmable analog element, comprising:

a programmable fuse array comprising:
  a plurality of programmable data fuses, each of which is transformed from an "intact" state to a "blown" state in response to a respective program signal, and
  a programmable lock fuse which, when blown in response to a program signal, prevents any additional data fuses from being transformed to their blown state, a digital interface which conveys an end-user-specified digital bit pattern to a programming circuit, a programming circuit arranged to provide said program signals to said programmable data fuses in accordance with said end-user-specified digital bit pattern, a first register connected to said digital interface and arranged to store said end-user-specified digital bit pattern, a second register connected to said data fuses and arranged to store their respective states, a multiplexer having a control input and which conveys the contents of said first register to its output when the signal at said control input is in a first state and conveys the contents of said second register to its output when the signal at said control input is in a second state, said multiplexer output being the output of said one-time end-user-programmable fuse array circuit and suitable for connection to a programmable analog element, and a comparator connected at its inputs to said first and second registers, said comparator arranged to produce a first signal when the states of said data fuses match said end-user-specified digital bit pattern and to produce a second signal when the states of said data fuses do not match said end-user-specified digital bit pattern, said programming circuit further arranged to receive said comparator output and to provide said program signal to blow said lock fuse when said comparator output indicates that the states of said data fuses match said end-user-specified digital bit pattern.

13. The end-user-programmable fuse array circuit of claim 12, further comprising a programmable analog element connected to and thereby programmed by said one-time end-user-programmable fuse array circuit output.

14. The end-user-programmable fuse array circuit of claim 12, further comprising a first programmable test fuse which, when successfully blown in response to a program signal, indicates that said one-time end-user-programmable fuse array circuit is functioning properly, said programming circuit arranged to:

provide said program signal to blow said first programmable test fuse prior to providing said program signals to said programmable data fuses, determine the state of said first programmable test fuse, and to provide an output which indicates the state of said first programmable test fuse.

15. A one-time end-user-programmable digital potentiometer, comprising:

a programmable digital potentiometer which provides a resistance which varies with a digital bit pattern applied at an input, and a one-time end-user-programmable fuse array circuit, comprising:
  a programmable fuse array comprising:
    a plurality of programmable data fuses, each of which is transformed from an "intact" state to a "blown" state in response to a respective program signal, and
    a programmable lock fuse which, when blown in response to a program signal, prevents any additional data fuses from being transformed to their blown state,
  a digital interface which conveys an end-user-specified digital bit pattern to a programming circuit,
  a programming circuit arranged to provide said program signals to said programmable data fuses in accordance with said end-user-specified digital bit pattern, and
  a validation means which outputs a first signal when the states of said data fuses match said end-user-specified digital bit pattern and a second signal when the states of said data fuses do not match said end-user-specified digital bit pattern,
  said programming circuit further arranged to receive said validation means output and to provide said program signal to blow said lock fuse when said validation means indicates that the states of said data fuses match said end-user-specified digital bit pattern,
  said one-time end-user-programmable fuse array circuit arranged to provide said end-user-specified digital bit pattern at a fuse array circuit output when said lock fuse is intact and to provide the states of said data fuses at said fuse array circuit output when said lock fuse is blown, the input of said digital potentiometer connected to said fuse array circuit output such that the resistance of said digital potentiometer is controlled via said one-time end-user-programmable fuse array circuit.

16. A method of programming a fuse array circuit suitable for use by an end-user, comprising:

providing an end-user-specified digital bit pattern to a programmable analog element, programming a programmable fuse array to correspond with said end-user-specified digital bit pattern, comparing the states of the fuses in said programmable fuse array with said end-user-specified digital bit pattern, reporting the results of said comparison to said end-user, and if the states of the fuses in said programmable fuse array match said end-user-specified digital bit pattern:
  prohibiting the programming of any other fuses in said fuse array, and
  providing the states of the fuses in said programmable fuse array to said programmable analog element.

17. The method of claim 16, further comprising the steps of:

storing said end-user-specified digital bit pattern, and storing the states of the fuses in said programmable fuse array, said comparing step comprising comparing said stored end-user-specified digital bit pattern and said stored fuse states.

18. The method of claim 16, further comprising the steps of:
   programming a test fuse prior to said step of programming said programmable fuse array,
   determining the state of said test fuse,
   reporting the state of said test fuse to said end-user, and
   programming said programmable fuse array if said test fuse is successfully blown.

* * * * *